(12) United States Patent
Latham et al.

(10) Patent No.: US 11,800,813 B2
(45) Date of Patent: Oct. 24, 2023

(54) HIGH ISOLATION CURRENT SENSOR

(71) Applicant: Allegro MicroSystems, LLC, Manchester, NH (US)

(72) Inventors: Alexander Latham, Harvard, MA (US); Natasha Healey, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 384 days.

(21) Appl. No.: 16/887,045

(22) Filed: May 29, 2020

(65) Prior Publication Data

US 2021/0376227 A1 Dec. 2, 2021

(51) Int. Cl.
G01R 15/20 (2006.01)
G01R 19/00 (2006.01)
G01R 33/06 (2006.01)
H10N 50/80 (2023.01)
H01L 25/16 (2023.01)

(52) U.S. Cl.
CPC .......... *H10N 50/80* (2023.02); *G01R 15/207* (2013.01); *G01R 19/0092* (2013.01); *G01R 33/06* (2013.01); *H01L 25/16* (2013.01)

(58) Field of Classification Search
CPC ... H01L 43/02; G01R 15/207; G01R 19/0092; G01R 33/06
See application file for complete search history.

(56) References Cited

U.S. PATENT DOCUMENTS

| | | |
|---|---|---|
| 4,425,596 A | 1/1984 | Satou |
| 4,893,073 A | 1/1990 | McDonald et al. |
| 5,041,780 A | 8/1991 | Rippel |
| 5,124,642 A | 6/1992 | Marx |
| 5,247,202 A | 9/1993 | Popovic et al. |
| 5,442,228 A | 8/1995 | Pham et al. |
| 5,561,366 A | 10/1996 | Takahashi et al. |
| 5,615,075 A | 3/1997 | Kim |

(Continued)

FOREIGN PATENT DOCUMENTS

| | | |
|---|---|---|
| DE | 4 141 386 A1 | 6/1993 |
| EP | 0 867 725 A1 | 9/1998 |

(Continued)

OTHER PUBLICATIONS

U.S. Notice of Allowance dated Feb. 1, 2022 for U.S. Appl. No. 16/574,621; 7 Pages.

(Continued)

*Primary Examiner* — Reena Aurora

(74) *Attorney, Agent, or Firm* — DALY CROWLEY MOFFORD & DURKEE, LLP

(57) ABSTRACT

Methods and apparatus for providing a high isolation current sensor. In embodiments, a current sensor includes a leadframe having a current conductor first portion and a second portion, a magnetic field sensing element positioned in relation to the current conductor for detecting a magnetic generated by current flow through the current conductor, and a die supported by at least a portion of the first and/or second portions of the leadframe, wherein the first portion of the lead frame includes an isolation region aligned with a first edge of the die. In embodiments, a current sensor includes SOI processing and features to enhance active layer isolation.

35 Claims, 13 Drawing Sheets

(56) References Cited

U.S. PATENT DOCUMENTS

| | | | |
|---|---|---|---|
| 6,005,383 | A | 12/1999 | Savary et al. |
| 6,150,714 | A | 11/2000 | Andreycak et al. |
| 6,252,389 | B1 | 6/2001 | Baba et al. |
| 6,316,931 | B1 | 11/2001 | Nakagawa et al. |
| 6,323,634 | B1 | 11/2001 | Nakagawa et al. |
| 6,356,068 | B1 | 3/2002 | Steiner et al. |
| 6,411,078 | B1 | 6/2002 | Nakagawa et al. |
| 6,424,018 | B1 | 7/2002 | Ohtsuka |
| 6,445,171 | B2 | 9/2002 | Sandquist et al. |
| 6,462,531 | B1 | 10/2002 | Ohtsuka |
| 6,545,456 | B1 | 4/2003 | Radosevich et al. |
| 6,566,856 | B2 | 6/2003 | Sandquist et al. |
| 6,642,705 | B2 | 11/2003 | Kawase |
| 6,667,682 | B2 | 12/2003 | Wan et al. |
| 6,683,448 | B1 | 1/2004 | Ohtsuka |
| 6,727,683 | B2 | 4/2004 | Goto et al. |
| 6,759,841 | B2 | 7/2004 | Goto et al. |
| 6,781,359 | B2 | 8/2004 | Stauth et al. |
| 6,791,313 | B2 | 9/2004 | Ohtsuka |
| 6,812,687 | B1 | 11/2004 | Ohtsuka |
| 6,841,989 | B2 | 1/2005 | Goto et al. |
| 6,853,178 | B2 | 2/2005 | Hayat-Dawoodi |
| 6,867,573 | B1 | 3/2005 | Carper |
| 6,921,955 | B2 | 7/2005 | Goto et al. |
| 6,989,665 | B2 | 1/2006 | Goto et al. |
| 6,995,315 | B2 | 2/2006 | Sharma et al. |
| 7,006,749 | B2 | 2/2006 | Illich et al. |
| 7,075,287 | B1 | 7/2006 | Mangtani et al. |
| 7,166,807 | B2 | 1/2007 | Gagnon et al. |
| 7,248,045 | B2 | 7/2007 | Shoji |
| 7,259,545 | B2 | 8/2007 | Stauth et al. |
| 7,348,724 | B2 | 3/2008 | Lee |
| 7,476,816 | B2 | 1/2009 | Doogue et al. |
| 7,598,601 | B2 | 10/2009 | Taylor et al. |
| 7,709,754 | B2 | 5/2010 | Doogue et al. |
| 8,080,994 | B2 | 12/2011 | Taylor et al. |
| 8,629,539 | B2 | 1/2014 | Milano et al. |
| 8,907,437 | B2 | 12/2014 | Milano et al. |
| 9,190,606 | B2 | 11/2015 | Liu et al. |
| 9,299,915 | B2 | 3/2016 | Milano et al. |
| 9,362,209 | B1 | 6/2016 | Mangrum |
| 9,620,705 | B2 | 4/2017 | Milano et al. |
| 9,735,773 | B2 | 8/2017 | McIntosh et al. |
| 9,865,807 | B2 | 1/2018 | Liu et al. |
| 9,958,482 | B1 | 5/2018 | Latham |
| 10,114,044 | B2 | 10/2018 | Geisler et al. |
| 10,247,758 | B2 | 4/2019 | Milano et al. |
| 10,333,055 | B2 | 6/2019 | Milano et al. |
| 10,345,343 | B2 | 7/2019 | Milano et al. |
| 2001/0028115 | A1 | 10/2001 | Yanagawa et al. |
| 2002/0179987 | A1 | 12/2002 | Meyer et al. |
| 2004/0155644 | A1 | 8/2004 | Stauth et al. |
| 2005/0024908 | A1 | 2/2005 | Gizara |
| 2005/0045359 | A1 | 3/2005 | Doogue et al. |
| 2005/0224248 | A1 | 10/2005 | Gagnon et al. |
| 2005/0230843 | A1 | 10/2005 | Williams |
| 2006/0002147 | A1 | 1/2006 | Hong et al. |
| 2006/0071655 | A1 | 4/2006 | Shoji |
| 2006/0091993 | A1 | 5/2006 | Shoji |
| 2006/0114098 | A1 | 6/2006 | Shoji |
| 2006/0145690 | A1 | 7/2006 | Shoji |
| 2006/0170529 | A1 | 8/2006 | Shoji |
| 2006/0181263 | A1 | 8/2006 | Doogue et al. |
| 2006/0219436 | A1 | 10/2006 | Taylor et al. |
| 2006/0255797 | A1 | 11/2006 | Taylor et al. |
| 2006/0291106 | A1 | 12/2006 | Shoji |
| 2007/0044370 | A1 | 3/2007 | Shoji |
| 2007/0076322 | A1 | 4/2007 | Shoji |
| 2007/0090825 | A1 | 4/2007 | Shoji |
| 2007/0096716 | A1 | 5/2007 | Shoji |
| 2007/0188946 | A1 | 8/2007 | Shoji |
| 2007/0279053 | A1 | 12/2007 | Taylor et al. |
| 2008/0297138 | A1 | 12/2008 | Taylor et al. |
| 2009/0058412 | A1 | 3/2009 | Taylor et al. |
| 2009/0096072 | A1 | 4/2009 | Balakrishnan et al. |
| 2011/0204887 | A1 | 8/2011 | Ausserlechner et al. |
| 2014/0151697 | A1 | 6/2014 | Ausserlechner et al. |
| 2014/0175528 | A1 | 6/2014 | Zieren et al. |
| 2014/0253115 | A1 | 9/2014 | Ausserlechner |
| 2016/0282388 | A1 | 9/2016 | Milano et al. |
| 2020/0185234 | A1 | 6/2020 | Ancheta et al. |
| 2020/0289013 | A1* | 9/2020 | Bickford .............. A61B 5/6832 |
| 2020/0313078 | A1* | 10/2020 | Green ................ G01R 33/0052 |

FOREIGN PATENT DOCUMENTS

| | | |
|---|---|---|
| EP | 1 107 327 A2 | 6/2001 |
| EP | 1 107 328 A2 | 6/2001 |
| EP | 1 111 693 A2 | 6/2001 |
| EP | 1 180 804 A2 | 2/2002 |
| EP | 1 281 974 A2 | 2/2003 |
| EP | 3644069 | 4/2020 |
| JP | S 63-191069 | 8/1988 |
| JP | H 04-364472 | 12/1992 |
| JP | 2000/174357 | 6/2000 |
| JP | 2001/165963 | 6/2001 |
| JP | 2001/174486 | 6/2001 |
| JP | 2001/221815 | 8/2001 |
| JP | 2001/230467 | 8/2001 |
| JP | 2001/339109 | 12/2001 |
| JP | 2002/026419 | 1/2002 |
| JP | 2002/040058 | 2/2002 |
| JP | 2002/202326 | 7/2002 |
| JP | 2002/202327 | 7/2002 |
| JP | 61-71649 | 8/2017 |
| WO | WO 99/14605 | 3/1999 |
| WO | WO 2005/026749 A1 | 3/2005 |
| WO | WO 2006/130393 | 12/2006 |

OTHER PUBLICATIONS

Invitation to Pay Additional Fee dated May 25, 2021 for PCT Application No. PCT/US2021/018442; 17 pages.

Search Report and Written Opinion dated Aug. 19, 2021 for PCT Application No. PCT/US2021/018442; 24 pages.

U.S. Final Office Action dated Dec. 24, 2021 for U.S. Appl. No. 16/574,621; 10 Pages.

Response to US. Final Office Action dated Dec. 24, 2021 for U.S. Appl. No. 16/574,621; Response filed on Jan. 7, 2022; 6 Pages.

U.S. Restriction Requirement dated Mar. 26, 2021 for U.S. Appl. No. 16/574,621; 6 pages.

Response to U.S. Restriction Requirement dated Mar. 26, 2021 for U.S. Appl. No. 16/574,621; Response filed Mar. 30, 2021; 1 page.

Allegro MicroSystems, LLC, "Automotive-Grade, Galvanically Isolated Current Sensor IC with Common-Mode Field Rejection in a Small-Footprint SOIC8 Package;" ACS724 Datasheet, Rev. 15; Jun. 3, 2019; 33 Pages.

Response to U.S. Final Office Action dated Dec. 24, 2021 for U.S. Appl. No. 16/574,621; Response Filed Jan. 7, 2022; 6 Pages.

U.S. Appl. No. 16/574,621, filed Sep. 18, 2019, Briano et al.

U.S. Appl. No. 16/884,311, filed May 27, 2020, Liu et al.

Daughton, "Spin-Dependent Sensors;" Invited Paper; Proceedings of the IEEE, vol. 91, No. 5; May 2003; 6 Pages.

Lee et al.; "Fine Pitch Au—SnAgCu Joint-in-via Flip-Chip Packaging;" IEEE 9th Electronics Packaging. Technology Conference, Dec. 10-12, 2007; 7 Pages.

Mosbarger et al., "The Effects of Materials and Post-Mold Profiles on Plastic Encapsulated Integrated Circuits;" IEEE/IRPS; Apr. 1994; pp. 93-100; 8 Pages.

Steiner, et al.; "Fully Packaged CMOS Current Monitor Using Lead-on-Chip Technology;" Physical Electronics Laboratory, ETH Zurich, CH8093 Zurich, Switzerland; No. 0-7803-4412-X/98; IEEE 1998; pp. 603-608; 6 Pages.

Clemson University Vehicular Electronics Laboratory (CVEL); "Electromagnetic Compatibility;" inet: http://www.cvel.clemson.edu/emc/tutorials/Shielding02/Practical_Shielding.html; 9 Pages.

Wikipedia; "Electromagnetic Field;" inet: http://en.wikipedia.org/wiki/Electromagnetic_field; 7 Pages.

(56) References Cited

OTHER PUBLICATIONS

Wikipedia; "Electromagnetic Shielding;" inet: http://en.wikipedia.org/wiki/Electromagnetic_shielding; 3 Pages.
Wikipedia; "Magnetic Field;" inet: http://en.wikipedia.org/wiki/Magnetic_field; 25 Pages.
PCT International Search Report and Written Opinion dated Aug. 16, 2004 for International Application No. PCT/US2004/009908; 15 Pages.
PCT International Search Report and Written Opinion dated Sep. 25, 2006 for International Application No. PCT/US2006/019953; 10 Pages.
PCT International Preliminary Report on Patentability and Written Opinion of the ISA dated Dec. 13, 2007 for PCT Pat. App. PCT/US2006/019953; 7 Pages.
Chinese Office Action for Chinese National Stage Application No. CN 2004 80024296.5 dated Apr. 29, 2009; 14 Pages.
Chinese Office Action for Chinese National Stage Application No. CN 2004 80024296.5 dated Sep. 26, 2008; 7 Pages.
Chinese Office Action for Chinese National Stage Application No. CN 2004 80024296.5 dated May 6, 2008; 11 Pages.
Chinese Office Action for Chinese National Stage Application No. CN 2004 80024296.5 dated Nov. 23, 2007; 18 Pages.
European Office Action for European Application No. 04816162.4 dated Jun. 17, 2009; 5 Pages.
European Office Action for European Application No. 04816162.4 dated Jan. 2, 2008; 26 Pages.
European Office Action for European Application No. 04816162.4 dated Jun. 27, 2007; 8 Pages.
Extended European Search Report dated Feb. 4, 2011 for European Application No. 10183958.7; 6 Pages.
Extended European Search Report dated Feb. 10, 2010 for European Application No. 09000121.5; 5 Pages.
European Office Action dated Feb. 23, 2011 for European Application No. 09000121.5; 4 Pages.
Extended European Search Report dated Jan. 22, 2010 for European Application No. 09000123.1; 5 Pages.
European Official Communication dated May 16, 2008 for European Pat. App. No. 06770974.1-2216; 4 Pages.
Response to European Official Communication dated May 16, 2008 for European Pat. App. No. 06770974.1-2216; Response filed Nov. 26, 2008; 44 Pages.
European Intention to Grant dated Apr. 27, 2009 for European Pat. App. No. 06770974.1-2216; 6 Pages.
Japanese Final Office Action for Japanese Application No. 2006-524610 dated Apr. 23, 2009; 5 Pages.
Japanese Office Action for Japanese Application No. 2006-524610 dated Sep. 10, 2008; 11 Pages.
Japanese Office Action for Japanese Application No. 2006-524610 dated Jul. 10, 2008; 33 Pages.
Japanese Office Action (English Translation Only) dated May 16, 2011 for JP Pat. App. No. 2009-151851; 1 Page.
Japanese Amendment with( full English Translation) filed Sep. 28, 2011; for JP Pat. App. No. 2009-151851; 9 Pages.
Japanese Office Action (English Translation Only) dated May 19, 2011 for JP Pat. App. No. 2010-281774; 2 Pages.
Japanese Amendment filed on Aug. 18, 2011; for JP Pat. App. No. 2010-281774; 5 Pages.
Japanese Office Action (English Translation Only) dated May 19, 2011 for JP Pat. App. No. 2010-281804; 2 Pages.
Japanese Amendment filed on Sep. 21, 2011; for JP Pat. App. No. 2010-281804; 8 Pages.
Japanese Office Action (English Translation Only) dated May 19, 2011 for JP Pat. App. No. 2010-281828; 2 Pages.
Japanese Amendment filed on Aug. 18, 2011; for JP Pat. App. No. 2010-281828; 6 Pages.
Japanese $1^{st}$ Office Action (English Translation Only) dated Sep. 21, 2010 for Japanese Application No. 2008-513632; 2 Pages.
Japanese $2^{nd}$ Office Action (English Translation Only) dated May 19, 2011 for JP Pat. App. No. 2008513632; 2 Pages.
Letter to Yuasa and Hara including a First Set of Draft Claim Amendments for Consideration and a Second Set of Draft Claim Amendments for Consideration; dated Jul. 18, 2011; for JP Pat. App. No. 2008-513632; 14 pages.
Letter from Yuasa and Hara dated Sep. 20, 2011 and a Response filed on Aug. 18, 2011 for JP Pat. App. No. 2008-513632; 9 pages.
Japanese Office Action (English Translation Only) dated May 19, 2011 for JP Pat. App. No. 2010-281841; 2 Pages.
Japanese Amendment filed on Aug. 18, 2011; for JP Pat. App. No. 2010-281841; 7 Pages.
Korean Office Action (with English Translation) dated Jul. 22, 2010 for Korean Application No. 10-2006-7002842; 9 Pages.
Response (with English Translation) to Korean Office Action dated Jul. 22, 2010 for Korean Application No. 10-2006-7002842; Response Filed Sep. 16, 2010; 18 Pages.
U.S. Office Action dated Nov. 26, 2007 for U.S. Appl. No. 11/383,021; 19 Pages.
U.S. Response to Office Action dated Nov. 26, 2007 and filed on Feb. 26, 2008 for U.S. Appl. No. 11/383,021; 14 Pages.
U.S. Notice of Allowance dated Jun. 4, 2008 for U.S. Appl. No. 11/383,021; 9 Pages.
U.S. Notice of Allowance dated Jun. 10, 2009 for U.S. Appl. No. 12/171,651; 16 Pages.
U.S. Non-Final Office Action dated Apr. 19, 2021 for U.S. Appl. No. 16/574,621; 15 Pages.
Response to Office Action filed on Aug. 18, 2021 for U.S. Appl. No. 16/574,621; 13 pages.
European Communication Pursuant to Rules 161/162 dated Aug. 9, 2022 for European Application No. 21711129.3; 3 Pages.
PCT International Preliminary Amendment on Patentability dated Dec. 8, 2022 for International Application No. PCT/US2021/018442; 16 Pages.
Response to European Communication Pursuant to Rules 161/162 dated Aug. 9, 2022 for European Application No. 21711129.3; Response filed Feb. 7, 2023; 21 Pages.
Response to U.S. Non-Final Office Action dated May 22, 2023 for U.S. Appl. No. 17/650,874; Response filed Aug. 8, 2023; 7 Pages.
U.S. Restriction Requirement dated Mar. 7, 2023 for U.S. Appl. No. 17/650,874; 5 Pages.
Response (and Preliminary Amendment) to U.S. Restriction Requirement dated Mar. 7, 2023 for U.S. Appl. No. 17/650,874; Response filed May 4, 2023; 4 Pages.
U.S. Non-Final Office Action dated May 22, 2023 for U.S. Appl. No. 17/650,874; 7 Pages.

* cited by examiner

HIGH ISOLATION CURRENT SENSOR

BACKGROUND

As is known in the art, some current sensors use a magnetic field sensing element in proximity to a current conductor. The sensing element can generate an output signal having a magnitude proportional to the magnetic field induced by a current that flows through the current conductor.

Various parameters characterize the performance of current sensors, including sensitivity. Sensitivity is related to the magnitude of a change in output voltage from the sensing element in response to a change in the sensed current. The sensitivity of a current sensor can be influenced by a variety of factors, including a physical distance between the sensing element and the conductor.

Further, current sensors typically have a limited operational range with respect to an amount of current they can sense and thus measure. However, some applications may require sensing currents at amounts greater than the operational range of the respective current sensor. Voltage levels of signals to be sensed may be limited due to isolation characteristics of the sensor.

SUMMARY

Example embodiments of the invention provide methods an apparatus for a high isolation current sensor. In embodiments, an isolation region can be created, such as by etching, in a leadframe to increase a distance from a die to the current carrying portion of the leadframe so as to increase electrical isolation of the die and current carrying portion of the leadframe. In some embodiments, SOI processes and configurations are used to enhance isolation of the current sensor.

In one aspect, a current sensor comprises: a leadframe having a first portion and a second portion, wherein the first portion of the leadframe includes a current conductor; a magnetic field sensing element positioned in relation to the current conductor for detecting a magnetic field generated by current flow through the current conductor; and a die supported by at least a portion of the first and/or second portions of the leadframe, wherein the first portion of the lead frame includes an isolation region aligned with a first edge of the die.

A current sensor can further include one or more of the following features: an insulative layer applied to a surface of the die that faces the leadframe, the first edge of the die extends into the isolation region, the isolation region is at least partially filled with insulative mold compound, a shortest distance from the die edges to a location on the first portion of the leadframe is greater with the isolation region than without the isolation region, the current conductor has a U-shaped portion aligned with the magnetic field sensing element, a length of the isolation region is greater than a length of the first edge of the die, the die is configured in a flip chip configuration, the die is configured in a die-up configuration, the die is configured in a chip-on-lead configuration, the die comprises a silicon-on-insulator (SOI) configuration, the die comprises a bulk silicon layer, an oxide layer, and an active layer, a nonconductive layer abutting the active layer, a trench formed in the active layer and at an edge of the die, wherein the trench is filled with an insulative material, the second leadframe portion is configured for a higher voltage than the first leadframe portion and the trench is located above the second portion of the leadframe, the active layer is divided into first and second portions and electrically isolated from each other by an isolation island, wherein the first portion of the active layer is electrically connected to the first leadframe portion and the second portion of the active layer is electrically connected to the second leadframe portion, wherein the second leadframe portion is configured for a higher voltage than the first leadframe portion, and wherein the sensor has a flip chip configuration, the die comprises a bulk silicon layer, an oxide layer, and an active layer, wherein the bulk silicon layer is disposed on the second portion of the leadframe in a die up configuration, the second leadframe portion is configured for a higher voltage than the first leadframe portion, and wherein the sensor has a flip chip configuration, and the active layer is wirebonded to the first leadframe portion, the active layer is surrounded by a trench filled with insulative material, and/or a layer of non-conductive material between the bulk silicon layer and the second leadframe portion.

In another aspect, a current sensor comprises: a leadframe having a first portion and a second portion, wherein the first portion of the leadframe includes a current conductor, and wherein the first and second portions of the leadframe are separate from each other; a magnetic field sensing element positioned in relation to the current conductor for detecting a magnetic field generated by current flow through the current conductor; and an SOI die supported by at least a portion of the first and/or second portions of the leadframe, wherein the die comprises a silicon layer, an oxide layer, and an active layer.

A current sensor can further include one or more of the following features: the die further includes and an insulative adhesive layer on the active layer, the active layer includes an oxide portion located at an edge of the active layer, the second portion of the leadframe is configured for a lower voltage than the first portion of the leadframe, wherein the active layer is coupled to the second portion of the leadframe, an oxide portion located at an edge of the active layer is aligned over the first portion of the leadframe, the adhesive layer comprises BCB or polyimide, the die is supported by the first and second portions of the leadframe, wherein the active layer is separated into separate first and second portions by an oxide island, wherein the first portion of the active layer is connected to the first portion of the leadframe and the second portion of the active layer is connected to the second portion of the active layer, the first portion of the active layer is connected to the first portion of the leadframe by a first via and a first solder bump and the second portion of the active layer is connected to the second portion of the active layer by a second via and a second solder bump, the current sensor has a die up configuration, wherein the silicon layer of the die rests on the first portion of the leadframe, and wherein the active layer of the die is connected to the second portion of the leadframe by a wirebond, the active layer includes first and second oxide portions at edges of the die, a non-conductive layer between the silicon layer and the first portion of the leadframe, the non-conductive layer comprises tape having a larger area than an area of a leadframe-side of the die, the non-conductive layer comprises a die attach material, the first portion of the lead frame includes an isolation region aligned with a first edge of the die, an insulative layer applied to a surface of the die that faces the leadframe, the first edge of the die extends into the isolation region, the isolation region is at least partially filled with insulative mold compound, and/or a shortest distance from the die edges to a location on the first portion of the leadframe is greater with the isolation region than without the isolation region.

BRIEF DESCRIPTION OF THE DRAWINGS

The foregoing features may be more fully understood from the following description of the drawings in which.

DETAILED DESCRIPTION

Figure 1:
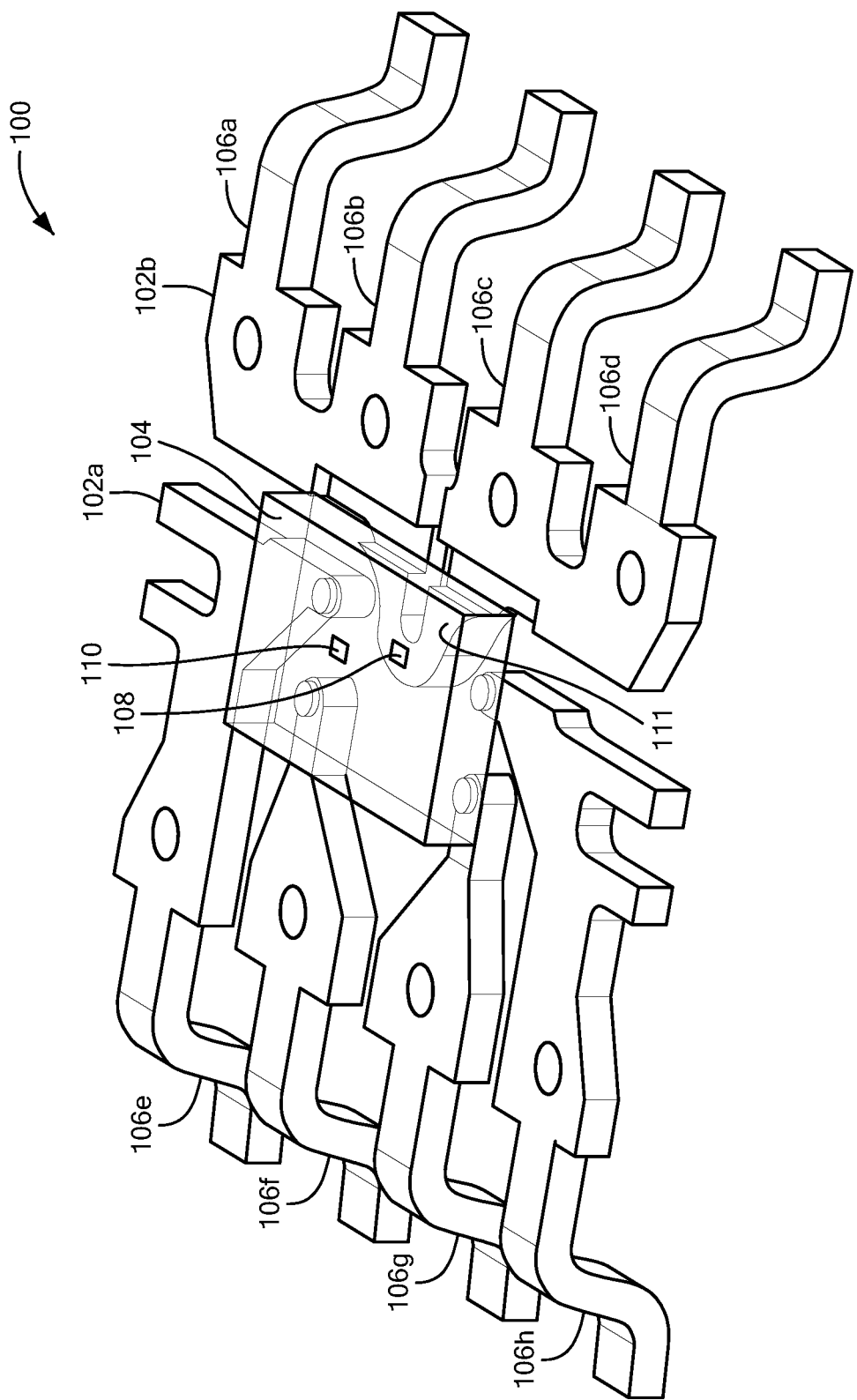
FIG. 1 is a partially transparent perspective view of a current sensor having enhanced isolation.

FIG. 1 shows an example current sensor 100 having a leadframe 102 that is etched to enhance voltage isolation levels. The leadframe 102 is etched to increase electrical isolation between a die 104 and the leadframe 102b by increasing a separation distance, which can also be referred to as the creepage distance. It is understood that increasing distance between different materials, particularly conductive materials, increases the electrical isolation. It is further understood that materials have dielectric properties, in addition to separation distance, that can determine the isolation voltage level and creepage distance. For example, mold compounds may be selected to have a high dielectric constant for achieving desired higher electrical isolation.

In the illustrated embodiment, the current sensor 100 is shown partially transparent and without encapsulant to facilitate an understanding of the disclosure. It is understood that the current sensor 100 can be provided as an integrated circuit (IC) package having leads. The current sensor 100 of FIG. 1 has a flip chip configuration with a bumped die and solder bumps, for example, providing electrical connections between the die and the lead fingers.

The current sensor 100 has the die 104 supported by the leadframe 102, which has a first portion 102a and a second portion 102b. In embodiments, the first and second portions 102a,b are formed from separate portions of conductive material, such as copper. The first portion 102a is connected to first, second, third, and fourth lead fingers 106e-h and the second portion 102b is connected to fifth, sixth, seventh, and eighth lead fingers 106a-d. The lead fingers can provide external IO for the sensor IC package.

The die 104 can include an analog and/or digital signal processing circuit 110 to process signals from a magnetic field sensing element 108 for sensing magnetic fields generated by current through leadfingers. It is understood that in the illustrated embodiment that circuitry for the digital signal processing circuit 110 and magnetic field sensing element 108 is located on leadframe-side of the die. In example embodiments, the first and second lead fingers 106a,b are a single node providing a current input (or output) and the third and fourth lead fingers 106c,d are a single node providing a current output (or input). This path can be considered a current conductor to which the current to be measured by the current sensor can be connected using external IO of the sensor IC package. In the illustrated embodiment, the current conductor includes an arcuate portion 111 for focusing current flow to enhance magnetic field detection by the magnetic field sensing element 108. Any practical number and type of magnetic field sensing elements can be used to meet the needs of a particular application. Etching of the leadframe 102 proximate the die 104 is discussed in detail below.

The processing circuit 110 may include a calibration circuit for calibrating a sensitivity of the sensor. For example, the magnetic field sensing element 108 may experience a change in sensitivity, for example and without limitations, due to temperature changes in an environment around and/or within current sensor 100. The change in sensitivity can impact the performance of magnetic field sensing element 108 and thus impact the accuracy of output signal of the current sensor 100. The calibration circuit can be configured to detect a change in sensitivity of magnetic field sensing element 108 by comparing an expected output of current sensor 100 to a measured output of current sensor. The calibration circuit can generate a compensation signal to modify and/or tune the output signal to account for the change in sensitivity.

Figure 2:
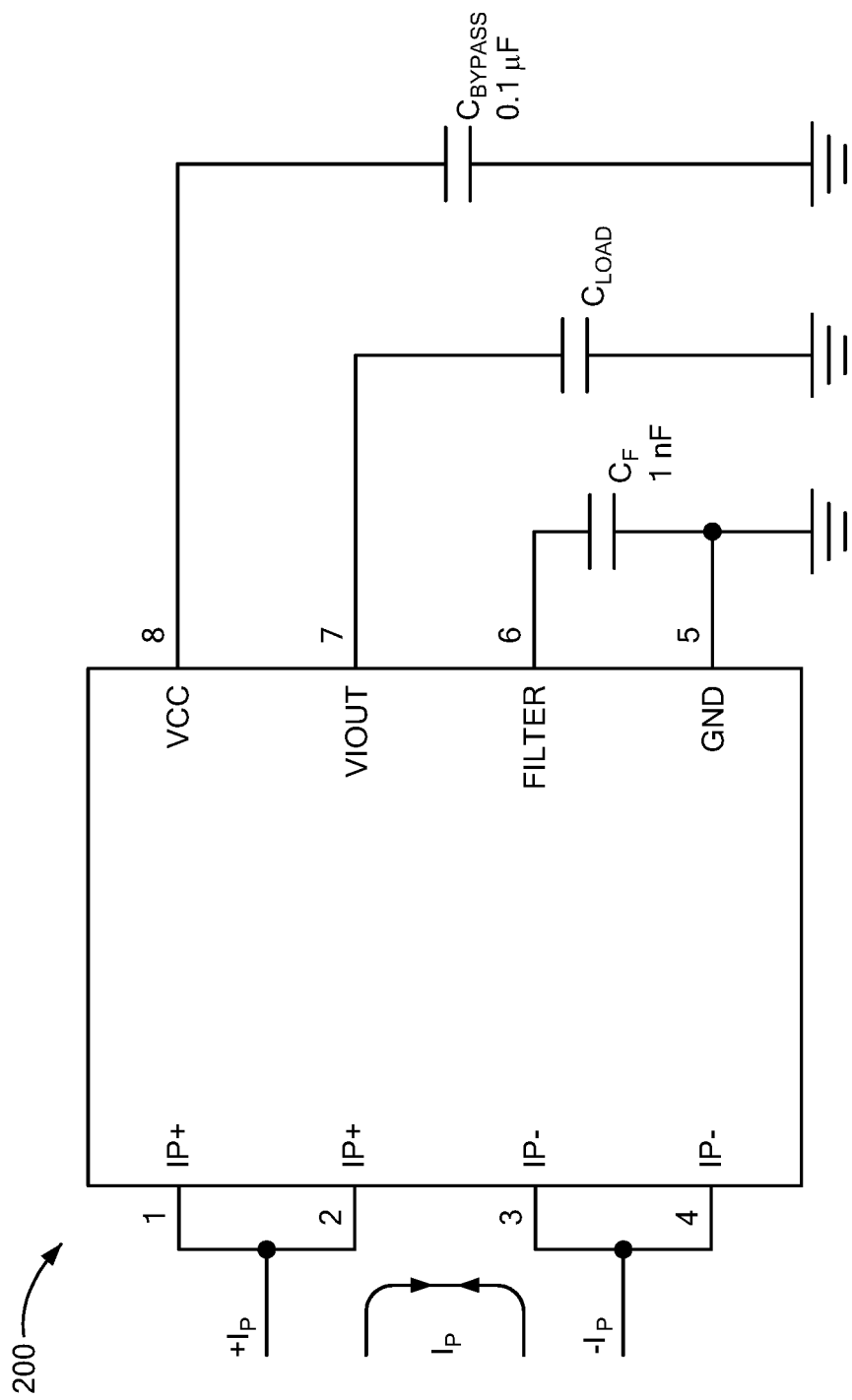
FIG. 2 is an example pinout diagram for the sensor of FIG. 1.

FIG. 2 shows an example IC package 200 implementation and pinout diagram. Current input (output) pins 1,2 can be provided by lead fingers 106a,b of FIG. 1 and output (input) pins 3,4 can be provided by leadfingers 106c,d. An output signal VIOUT on pin 7 outputs an analog signal that changes proportionally with the bidirectional AC or DC primary sensed current IP within a specified measurement range. The FILTER pin can be used to decrease the bandwidth in order to optimize noise performance.

Figure 3:
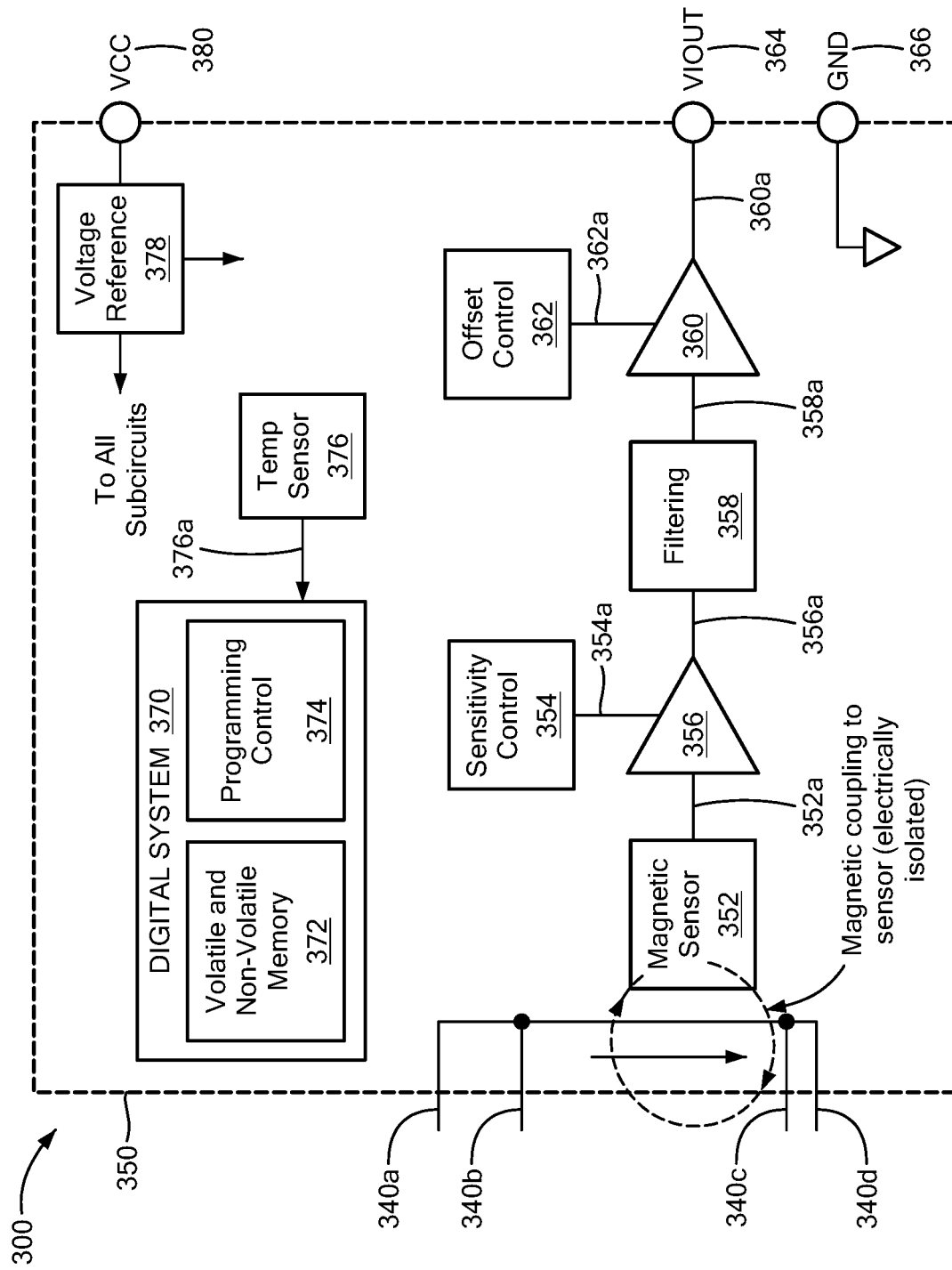
FIG. 3 is an example functional block diagram of the sensor of FIG. 1.

FIG. 3 shows an example current sensor implementation 300 for AC or DC current sensing for applications such as, motor control, load detection and management, switched-mode power supplies, overcurrent fault protection, and the like. Applied current flowing through the current conductor generates a magnetic field which is sensed by the magnetic field sensing element and converted into a proportional voltage. In embodiments, the current is sensed differentially in order to reject common-mode fields so as to improve accuracy in magnetically noisy environments. The inherent device accuracy is optimized through the close proximity of the magnetic field to the Hall transducer. A precise, proportional voltage is provided by the low-offset, chopper-stabilized BiCMOS Hall IC, which is programmed for accuracy after packaging. The output of the device has a positive slope when an increasing current flows through the primary copper conduction path (from pins 1 and 2, to pins 3 and 4 FIG. 2)), which is the path used for current sensing. The internal resistance of this conductive path is in the order of 1.2 mΩ, for example, providing low power loss. The terminals of the conductive path are electrically, isolated from the sensor leads (pins 5 through 8) which allows the current sensor IC to be used in high-side current sense applications without the use of high-side differential amplifiers.

As shown in FIG. 3, a current sensor 300 includes a magnetic field sensing circuit 350. Magnetic field sensing element 352, such as one or more Hall elements, is configured to sense the current. For example, magnetic field sensing element 352 may be positioned such that is can sense the current as it generates a magnetic field signal 352a. Current can flow into the sensor 300 via current input/output pins 340a,b and 340c,d, which may be similar to pins 1, 2, 3, 4 on sensor IC 200 of FIG. 2.

Magnetic sensing element 352 may include a Hall effect element and/or a magnetoresistance element. For example, the magnetoresistance element may include at least one of at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

A magnetic field signal 352a provided by the magnetic sensing element 352 is coupled to a first input of a first amplifier 356. A second input of first amplifier 356 may be coupled to an output of a sensitivity control circuit 354 configured to generate a compensation for a change in sensitivity experienced by magnetic field sensing element 352. Thus, in some embodiments, sensitivity signal 354a may include a compensation for the change in sensitivity of magnetic field sensing element 352. First amplifier 356 can change a gain of the magnetic field signal 352a depending upon a value of the sensitivity signal 356a.

An output of first amplifier 356 is coupled to an input of a filter 358. Filter 358 reduces the bandwidth of the current to be sensed and may include low-pass filtering. If the current being sensed is AC, filter 358 may include a bandpass filter. Filter 358 can be configured to receive the signal 356a and generate a filtered signal 358a. An output of filter 358 is coupled to second amplifier 360. An output of an offset control circuit 362 can be coupled to the second amplifier 360 to provide an offset control signal 362a. The offset control signal 362a may include an offset value to reduce an offset (e.g., DC offset) of the filtered signal 358a.

Second amplifier 360 can be configured to receive the filtered signal 358a and apply offset control signal 362a to the filtered signal 358a to generate a second control signal 360a. In an embodiment, an output of second amplifier 360 can be coupled to a $VI_{out}$ node of magnetic field sensing circuit 350. Thus, second control signal 360a may be the output of magnetic field sensing circuit 350.

Magnetic field sensing circuit 350 may include digital control circuits 370. Digital control circuits 370 include a memory circuit 372 and a processor circuit 374. Memory circuit 372 may include volatile and non-volatile memory. The non-volatile memory may store computer instructions, an operating system and/or data. Non-volatile memory may include one or more look-up tables for storing and organizing captured data, as well as any tables or matrices generated using the captured data. In one example, the computer instructions can be executed by the processor circuit 374 out of volatile memory. In some embodiments, sensitivity control circuit 354 and offset control circuit 362 can be components of digital control circuits 370.

In some embodiments, magnetic field sensing circuit 350 includes a temperature sensor 376. Temperature sensor 376 can be configured to detect a temperature in an environment around and/or within current sensor 300 and/or magnetic field sensing circuit 350. In some embodiments, temperature sensor 376 can detect a change in a temperature in the environment around and/or within current sensor 300 and/or magnetic field sensing circuit 350. For example, a change in a sensitivity of magnetic field sensing element 352 may be caused by from temperature changes. Thus, temperature sensor 376 can provide temperature information to digital control circuits 370.

An output of temperature sensor 350 is coupled to an input of digital control circuits 370 to provide a temperature signal 376a to digital control circuits 370. In some embodiments, the temperature information from temperature signal 376a may be used to generate the sensitivity signal 354a. For example, digital control circuits 370 may use temperature signal 376a to instruct sensitivity control circuit 354 on an amount to compensate the magnetic field signal 352a generated by magnetic field sensing element 352.

Magnetic field sensing circuit 350 may include a first and second reference voltage node 380, 366 and an output node 364. The first reference voltage node 380 (e.g., VCC) may be coupled to a voltage source. The voltage source may provide a voltage to magnetic field sensing circuit 350 and thus each of the components of magnetic field sensing circuit 350. The second reference voltage 366 may be coupled to ground. The output node 364 may correspond to an output of magnetic field sensing circuit 350.

Figure 3A:
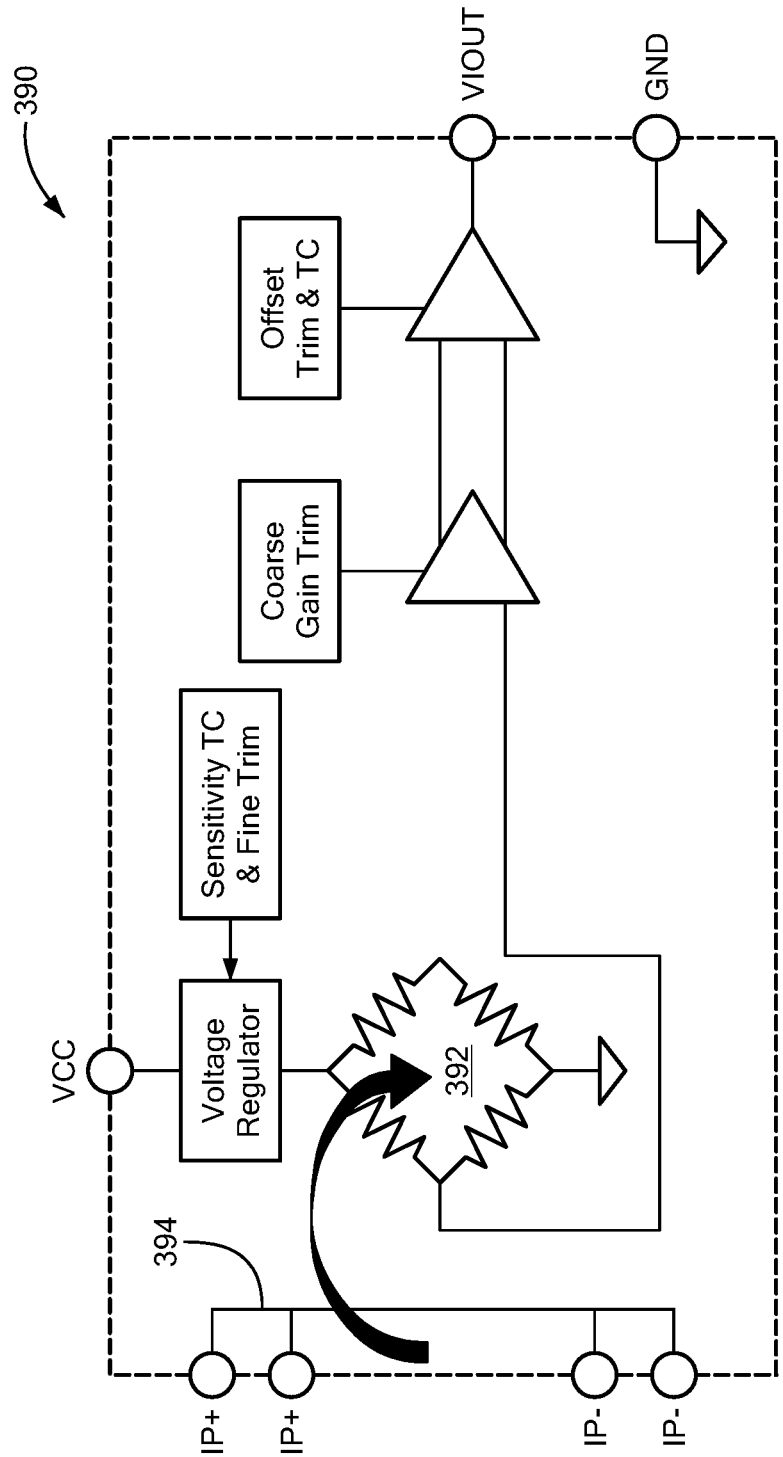
FIG. 3A is an example functional block diagram of the sensor of FIG. 1 having differential sensing.

FIG. 3A shows an example sensor 390 having similarity with the sensor 300 of FIG. 3 with a magnetic field sensing element 392 comprising a series of magnetoresistive sensing elements configured in a bridge positioned in relation to a current conductor 394. The bridge configuration of the magnetic field sensing element provides differential sensing.

Figure 4A:
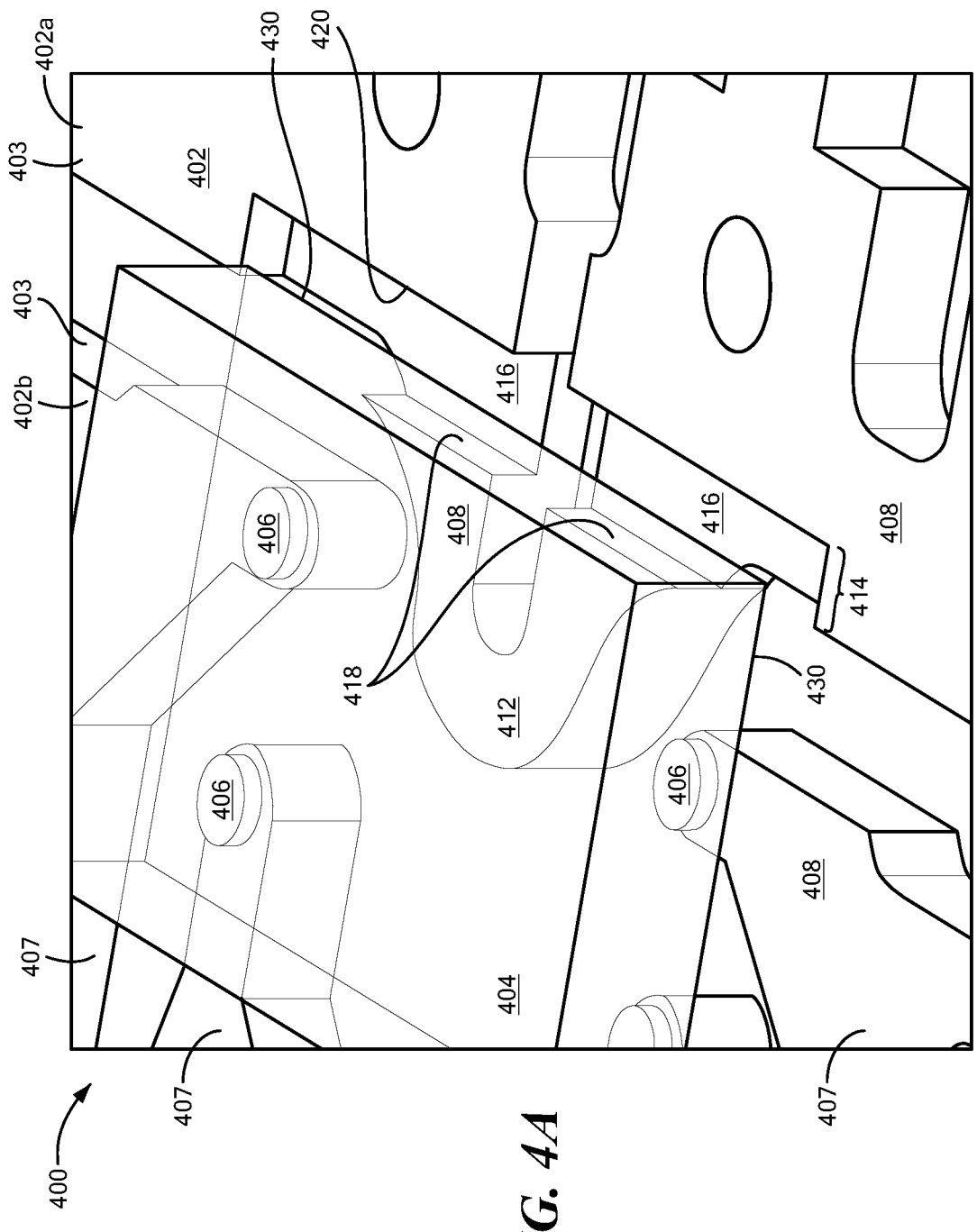
FIG. 4A is a partially transparent perspective view of a portion of the sensor of FIG. 1.
Figure 4B:
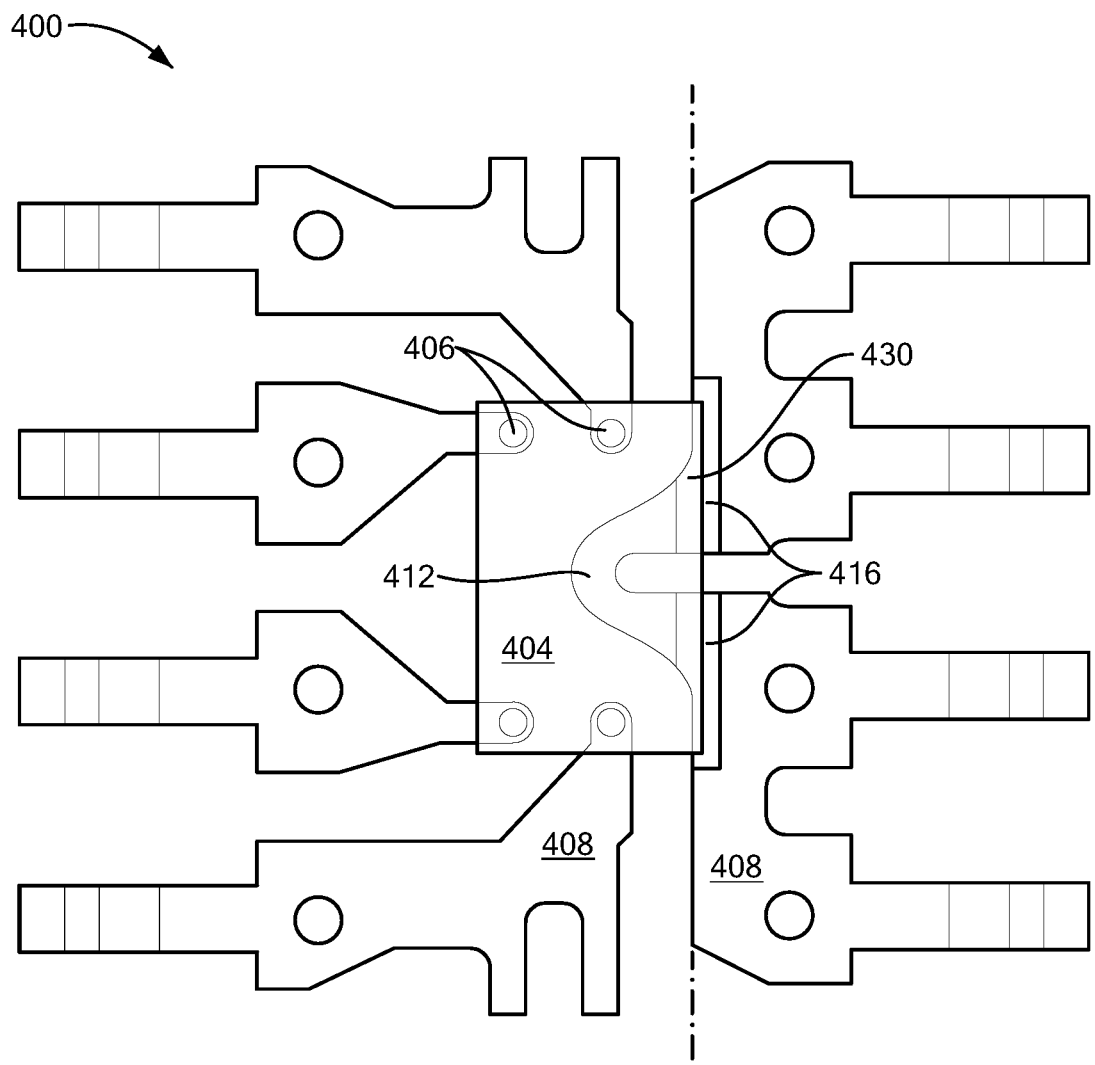
FIG. 4B is a partially transparent top view of a portion of the sensor of FIG. 1.
Figure 4C:
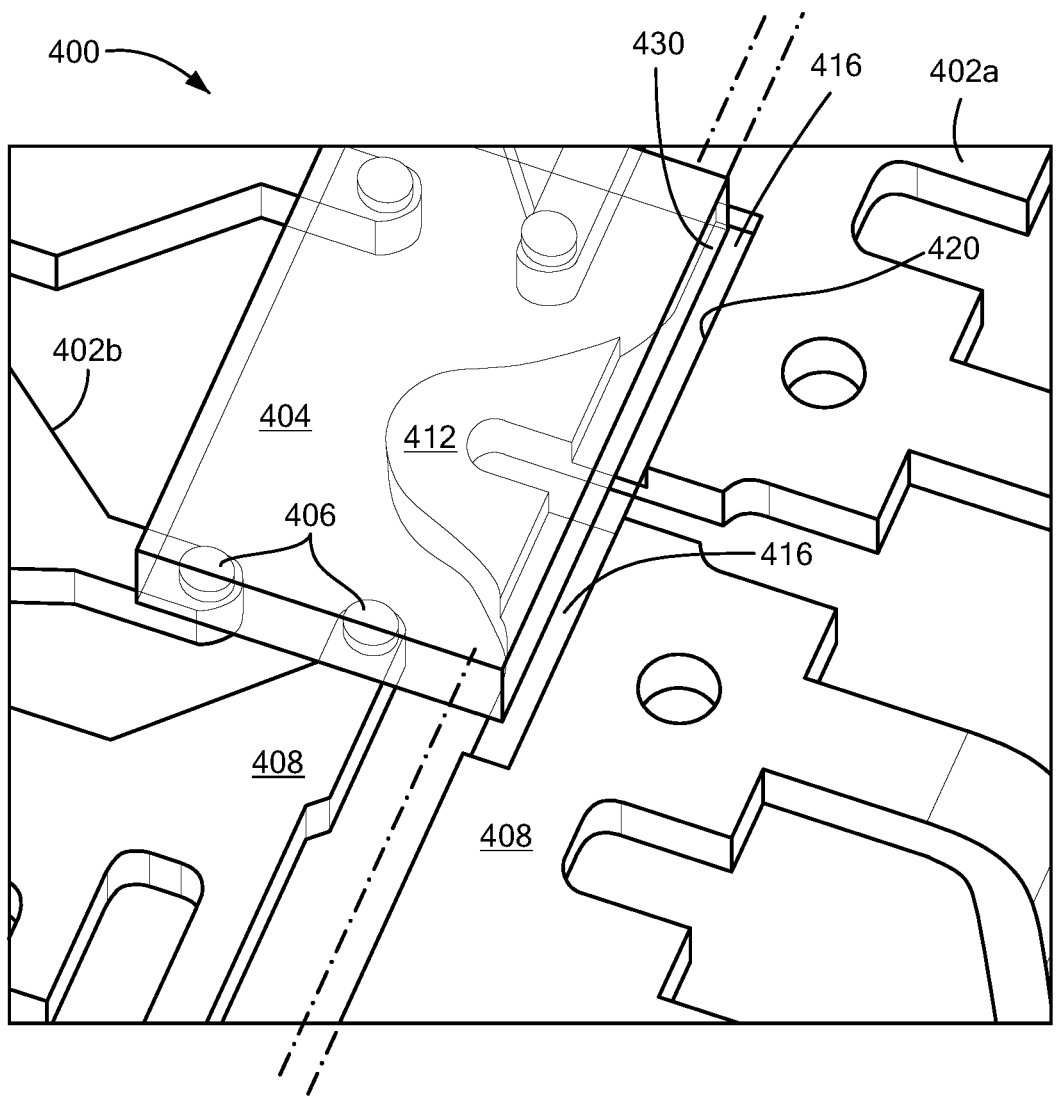
FIG. 4C is a partially transparent perspective view of a portion of the sensor of FIG. 1.

FIGS. 4A-C show further detail of sensor 400 having a leadframe 402 with etching to enhance electrical isolation and creepage characteristics. A bottom die edge extends into an isolation region so as to increase a distance from die-edge to the leadframe, as compared to not having an isolation region. By increasing this distance, the isolation voltage is increased, as described more fully below.

In embodiments, the voltage potential of the current carrying section of the lead-frame 402a may be volts to kvolts or higher relative to the signal side of the lead-frame 402b. Increasing the isolation of the leadframe and die is desirable to increase the voltage level of the signal to be sensed. Suitable epoxy mold compounds are available from rom SUMITOMO and include part numbers E670 and G700. These compounds have dielectric strengths of ~15 to 20 kV/mm.

In embodiments, a die 404 is supported by the leadframe 402 with various connections 406, e.g., solder, to various leadfingers 407 that can provide 10 connections, such an IC package output signal with a voltage proportional to the sensed current level, as described above.

The leadframe 402 has a top surface 408 that may form a plane on which a portion of the die 404 is supported. As described above, the leadframe 402 may comprise electrically isolated first and second leadframe portions 402a,b. The first leadframe portion 402a includes a U-shaped, for example, current conductor portion 412 above which a magnetic field sensing element in the die 404 can be located to sense a magnetic field generated by current flow.

In the example embodiment, the first leadframe portion 402a includes an isolation region 414 having a bottom surface 416 below the top surface 408. The isolation region 414 can include a first side 418 under the die 404 and a second side 420 on the leadfinger side of the first leadframe portion 402a. In embodiments, a length of the isolation region 414 is longer than a length of the die 404. In example embodiments, a width of the isolation region 414 formed in the leadframe is twice a depth of the isolation region. It is understood that isolation is provided by distance from the lead-frame to the edge of the die. The isolation region 414 depth creates a distance X from the bottom of the etch to the die edge. If the width is 2× this depth, then the distance from the edge of the etch to the die edge is X.

In embodiments, the die has an isolation layer on top of the die that protects everything but die edges from the primary loop. The isolation region increases the distance from the primary to the die edge.

It is understood that the isolation region 414 can comprise any practical geometry that serves to increase the creepage distance and isolation voltage of the die edge and leadframe. For example, the isolation region 414 can comprise a rounded channel, V-shape, U-shape, bulbous channel, and the like to meet the needs of a particular application.

As best seen in FIGS. 4B and 4C, in example embodiments, an edge 430 of a bottom of the die 404 extends into the isolation region 416. The isolation region 416 increase a distance from die-edge 430 to the leadframe 402 as compared to not having an isolation region. By increasing this distance, the isolation voltage is increased. For example, the isolation voltage may increase from about 3.5 kV with no isolation region 416 to about 4.3 kV with the isolation region.

To achieve leadframe-die isolation, one starts by having sufficient isolation through the die itself by having an isolation layer on top of the circuitry, such as polyimide or BCB. These materials are on the order of 200 to 700 V/um for dielectric strength, so 10 to 20 um is sufficient to get to an example 4 kV of isolation, depending on the material. The focus is on the path from the die edge to the high voltage section of the lead-frame (current carrying). If 20 kV/mm mold compound is used, that is 20 V/um. To get to 4 kV, one needs 200 um of distance through mold compound. There is also some isolation at the die edge based on how the die is sealed. In general, a certain level, e.g., kVs, through mold compound is needed, which results in needing a certain distance (um) of distance through the mold compound. Bumps on the die may be around 20 to 50 um high, so that another 80 to 150 um of distance is needed for a desired level of isolation. If we were to draw an arc from the edge of the die with a 180 um long string, that would provide the needed etch. In embodiments, etching is used to create square edges/shapes. If a 20 um bump height is assumed, then a 160 um deep etch is needed, and it should be 360 um wide everywhere it intersects the die edge. In embodiments, ~200 um deep etching is performed because most etches are done as "half" etches, and this is a 400 um thick lead-frame in an example embodiment.

Figure 5A:
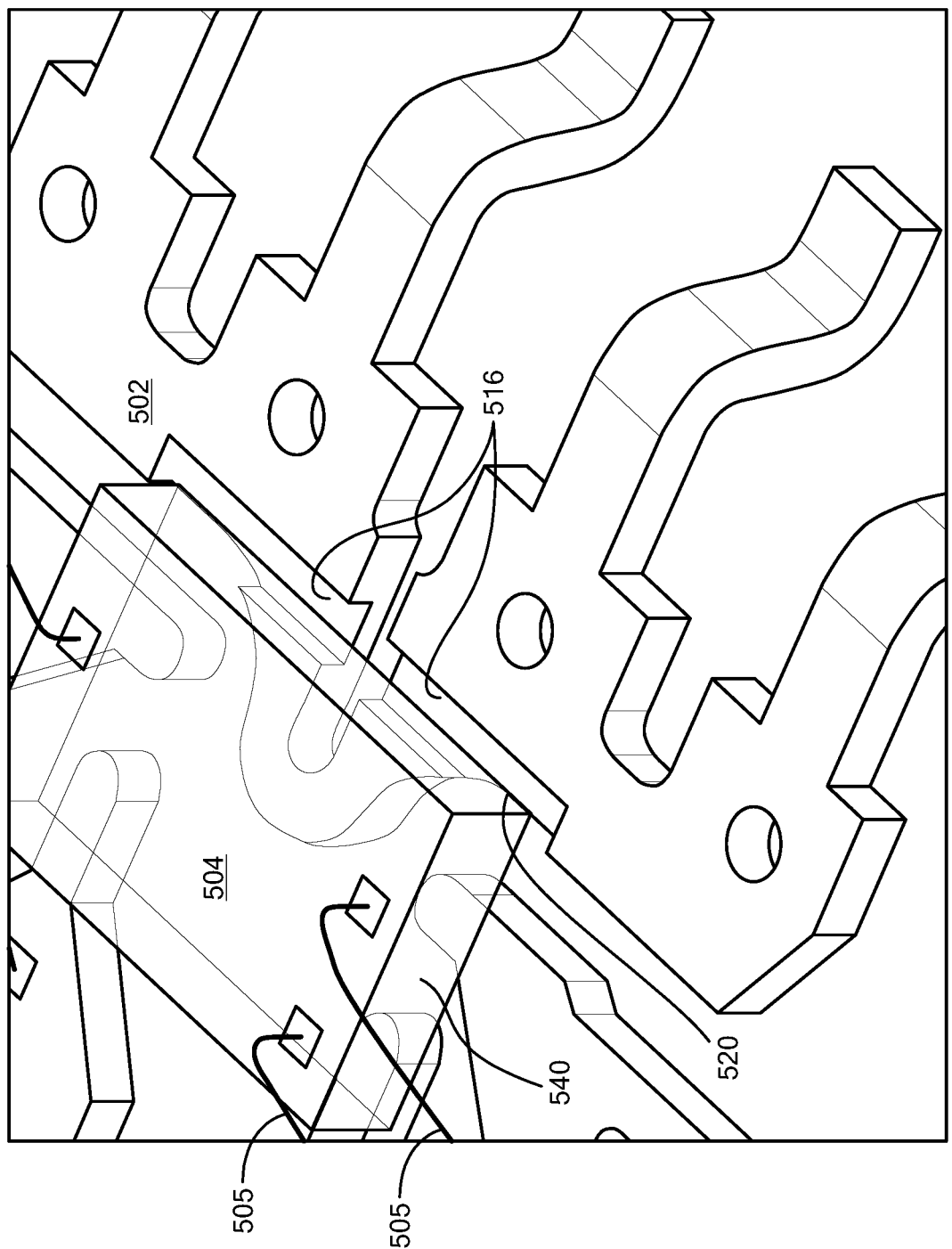
FIG. 5A is a partially transparent perspective view of a portion of sensor having enhanced isolation in a chip-on-lead configuration.
Figure 5B:
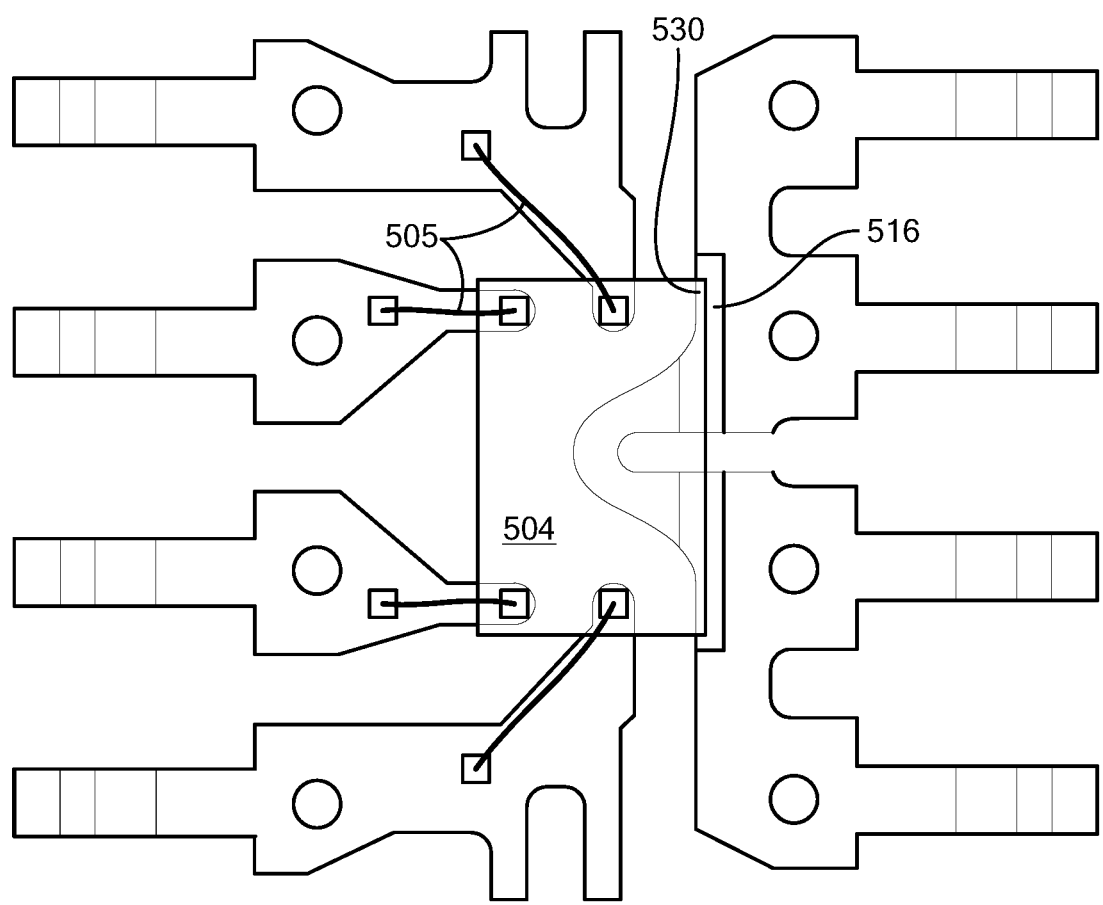
FIG. 5B is a partially transparent top view of a portion of the sensor of FIG. 5A.

FIGS. 5A and 5B show a top and perspective view respectively of a high isolation current sensor 500 having a chip-on-lead configuration where a leadframe 502 supports a die 504 that is 'up' so that die IO (and circuitry) are opposite the leadframe. Wirebonds 505 can be used to make connections from the die 504 to the leadfingers.

The leadframe 502 can be manipulated, e.g., etched, to create an isolation region 516 that increases a distance from an edge 530 of the die 504 and the leadframe 502 as compared to not having isolation region 516.

In embodiments, the die 504 is coated with an insulative material 540 on at least the leadframe-side of the die. The insulative material has a relatively high dielectric characteristic to enhance isolation of the die 504 and leadframe 502.

Figure 6A:
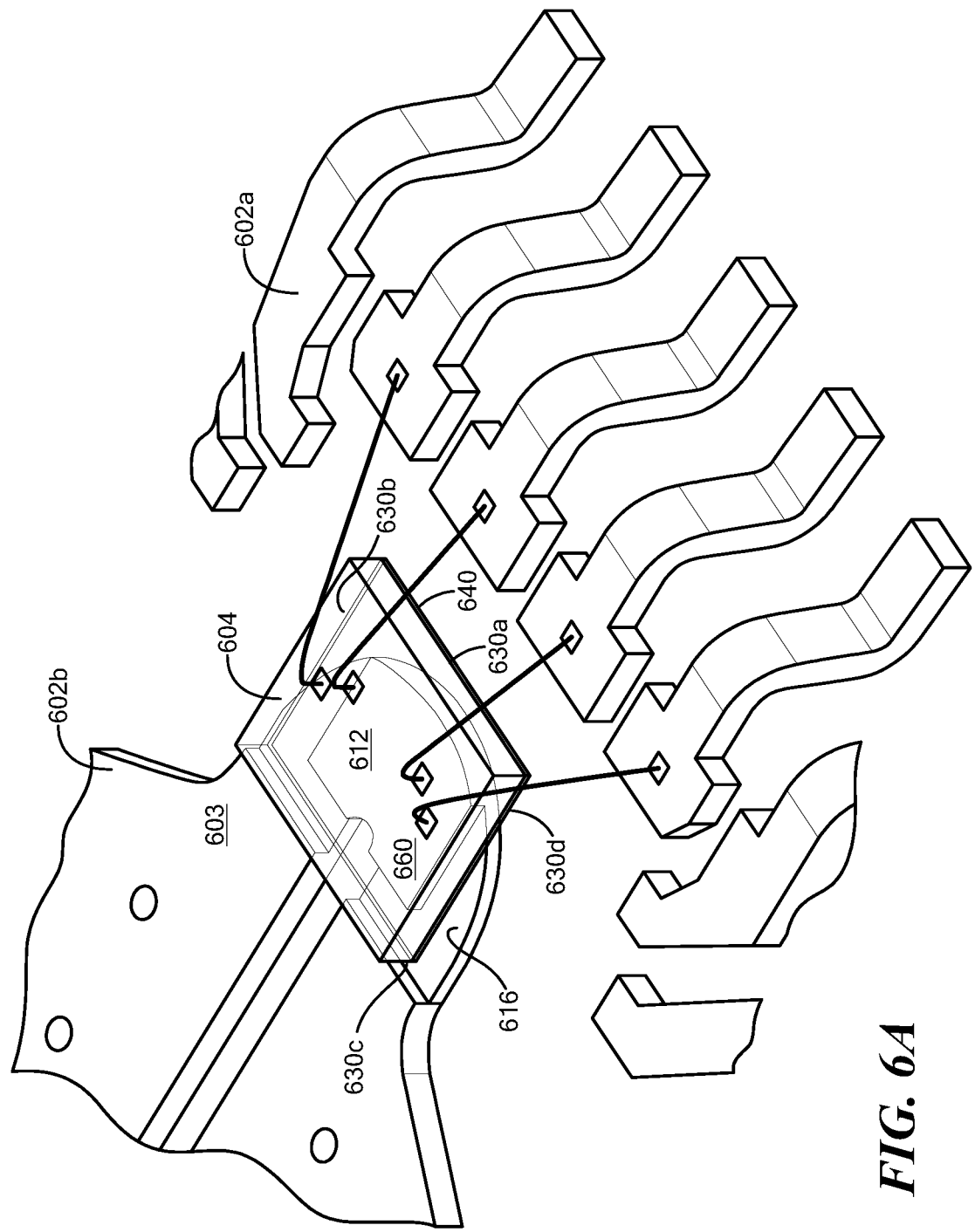
FIG. 6A is a partially transparent perspective view of a portion of sensor having enhanced isolation in a die up on current loop configuration.
Figure 6B:
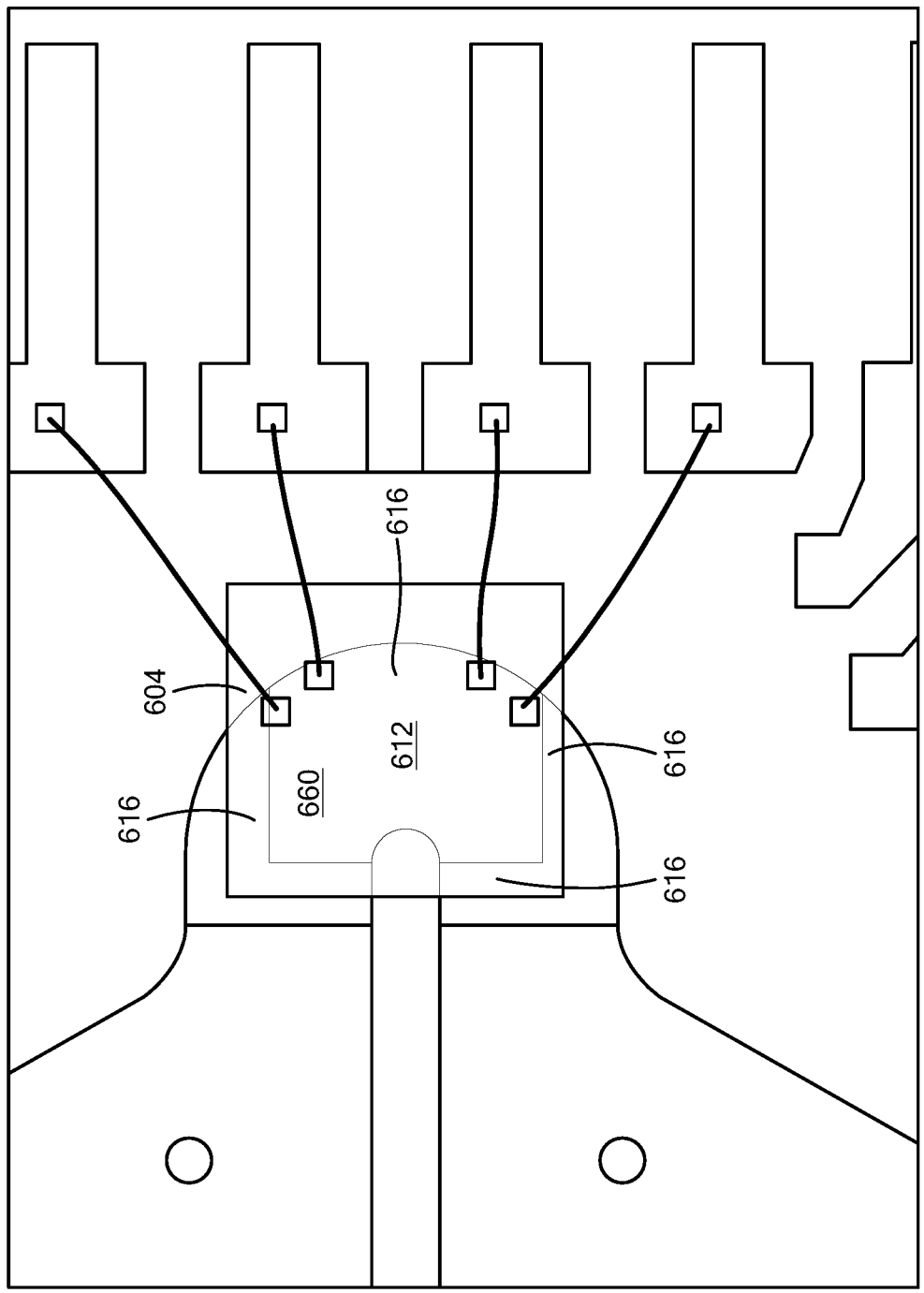
FIG. 6B is a partially transparent top view of a portion of the sensor of FIG. 6A.

FIGS. 6A and 6B show a current sensor 600 having a die up on current loop configuration. A leadframe 602a,b has an etched current loop 603 that supports a die 604. The leadframe 602 can include leadfingers 602a and the current loop 602b portion. An insulative layer 640 insulates the die 604 from the current loop 603. In the illustrated embodiment, the die 604 overlaps with the second portion 602b of the leadframe, which includes the current loop 603, but not the first portion 602a of the leadframe.

In embodiments, the current loop 603 is etched to create an isolation region 616 that surrounds an inner region 660 of the current loop that abuts the die 604 and insulative layer 640. With this arrangement, edges 630a,b,c,d of the die are increased in distance from the conductive current loop 603 material as compared to not having an isolation region. In general, anywhere the die-edge and current carrying leadframe overlap, an etch can increase the distance from the metal to the die edge.

In another aspect, current sensors can include a silicon on insulator (SOI) configuration to enhance isolation between the die and the leadframe. One or more oxide layers and/or other materials can seal active circuitry and increase the isolation voltage level.

FIG. 7 shows an example current sensor 700 having a flip chip configuration with a leadframe 702 bumped to a die 704. The current sensor 700 may have some similarity with the current sensor 400 of FIGS. 4A-C with or without an isolation region. In the illustrated embodiment, the die 704 is connected to a first portion 702a of the leadframe, which is at a lower voltage than a second portion 702b of the leadframe.

The die 704 comprises a bulk silicon layer 706, an oxide layer 708, which can comprise SiO2, an active layer 710, and an adhesive layer 712, which can comprise benzocyclobutene (BCB) or polyimide, for example. The insulative SiO2 layer 708 and the BCB/PI layer 712, which may be used in a solder bumping process, seals around the active circuitry 710 where the die 704 overlaps the high voltage second portion 702b of the lead-frame, which provides the current conductor loop. One or more solder ball 714 and via 716 provide an electrical connection from the active layer 710 to the second portion 702b of the leadframe.

In embodiments, a first trench 720a is be formed at an edge of the active layer 710 and filled with SiO2 or other insulative material. The SiO2-filled trench 720a, which may be in the order of 0.4 mm, and BCB layer 712 may combine to reinforce electrical isolation of the die and leadframe 702. In example embodiments, over 5 kV of isolation can be achieved.

Figure 7A:
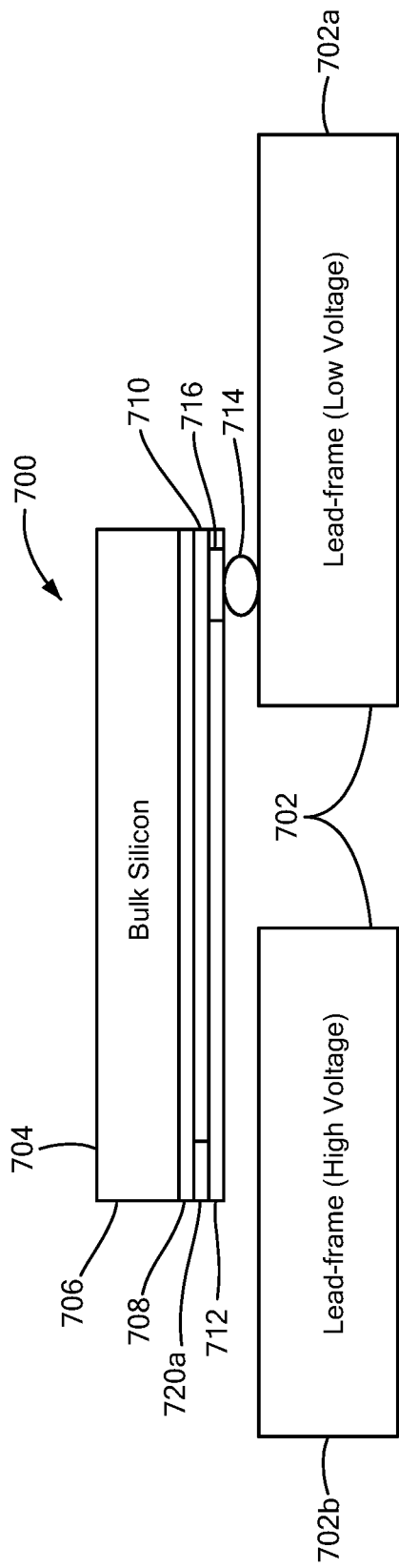
FIG. 7A is a schematic representation of a current sensing having enhanced isolation with a SOI substrate in a flip chip configuration.
Figure 7B:
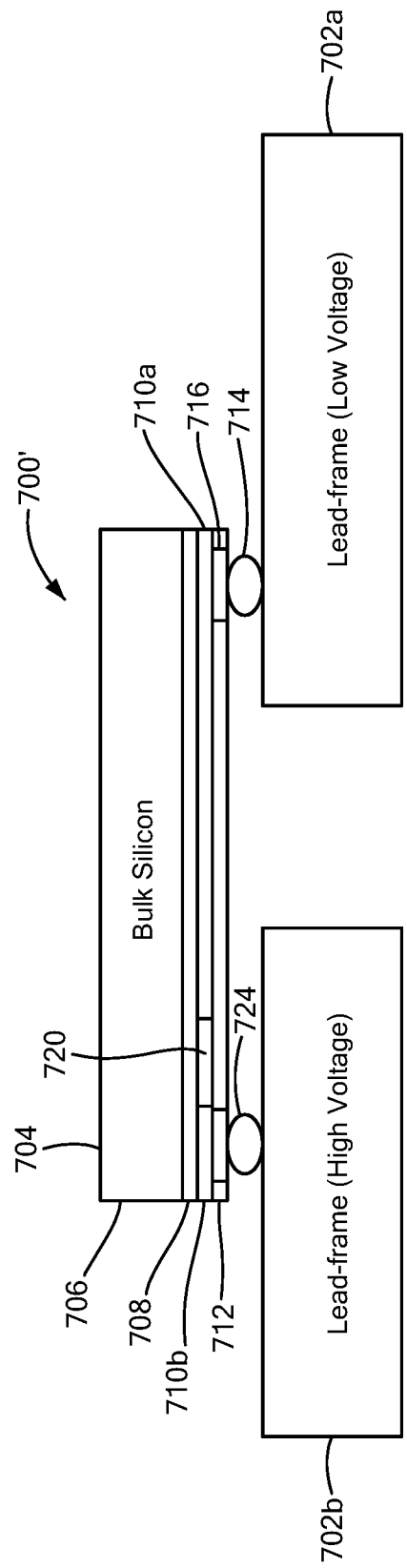
FIG. 7B is a schematic representation of a current sensing having enhanced isolation with a SOI substrate in a flip chip configuration with a connection to a high voltage portion of a leadframe.

FIG. 7B shows an example current sensor 700' having a flip chip configuration with commonality to the current sensor 700 of FIG. 7A with the addition of an electrical connection to the high voltage second leadframe portion 702b. In the illustrated embodiment, a trench 720 filled with an insulative material, such as SiO2, electrically isolates first and second portions 710a,b of the active layer.

SOI processing allows for relatively deep trenches to isolate sections of the active layer 710 of the die from each other. The SiO2 filled trench 720 provides one or more isolation islands. In an example embodiment, one or more solder bumps 724 provide a connection(s) to the high voltage second portion 702b of the leadframe. With this arrangement, the layout and package construction of flip chip current sensors having high isolation may be simpler than cantilevered approaches. It is understood that FIG. 7A shows an example cantilevered configuration. An isolated bump can keep spacing consistent by preventing the die from sagging.

Figure 8A:
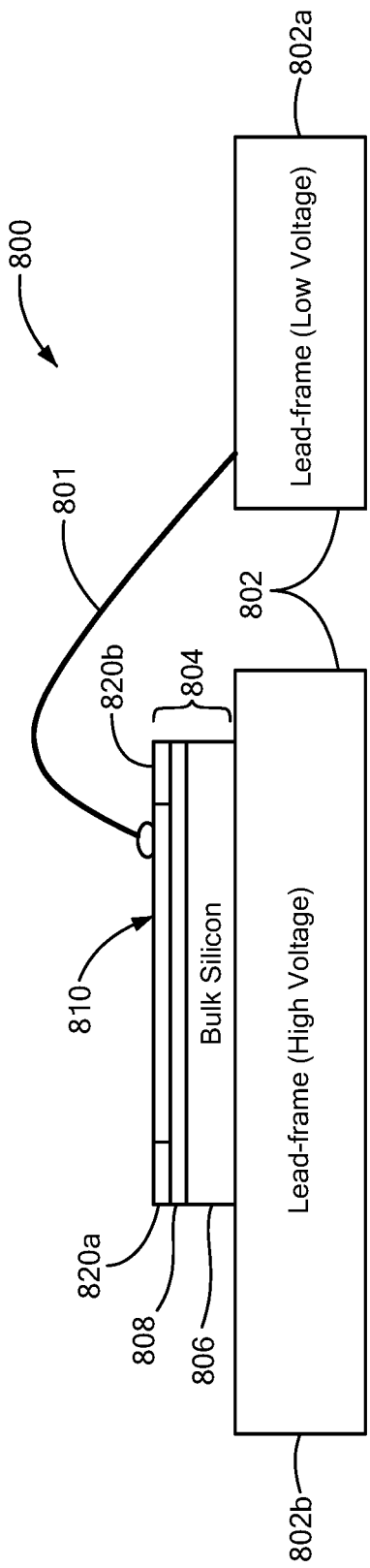
FIG. 8A is a schematic representation of a current sensing having enhanced isolation with a SOI substrate in a die up configuration.

FIG. 8A shows an example current sensor 800 having a die up configuration having wirebond(s) 801 from a lower voltage first portion 802a of the leadframe 802 to a die 804. The die 804 comprises a bulk silicon layer 806, an oxide layer 808, which can comprise SiO2, and an active layer 810 to which the wirebonds 801 are connected. In the illustrated embodiment, the bulk silicon layer 806 of the die is supported by the high voltage second portion 802b of the leadframe.

Insulation is provided by the SOI process and structure, which may be the only insulation in a die up construction. SOI current sensor embodiments may have higher isolation capability per micron than non-conductive die attach implementations. In addition, trenches 820a,b can provide an insulating moat around edges of the die 804. This create a longer path through mold compound to the active circuitry 810. In example embodiments, isolation levels of at least 5 kV can be achieved.

In embodiments, the wire-bonds 801 should go up (vertically) from the die 804 before going down to the low voltage leadframe 802a so that the distance through mold compound from the high voltage lead-frame to the wire-bond is sufficient to meet a desired isolation voltage level, e.g., 5 kV.

Figure 8B:
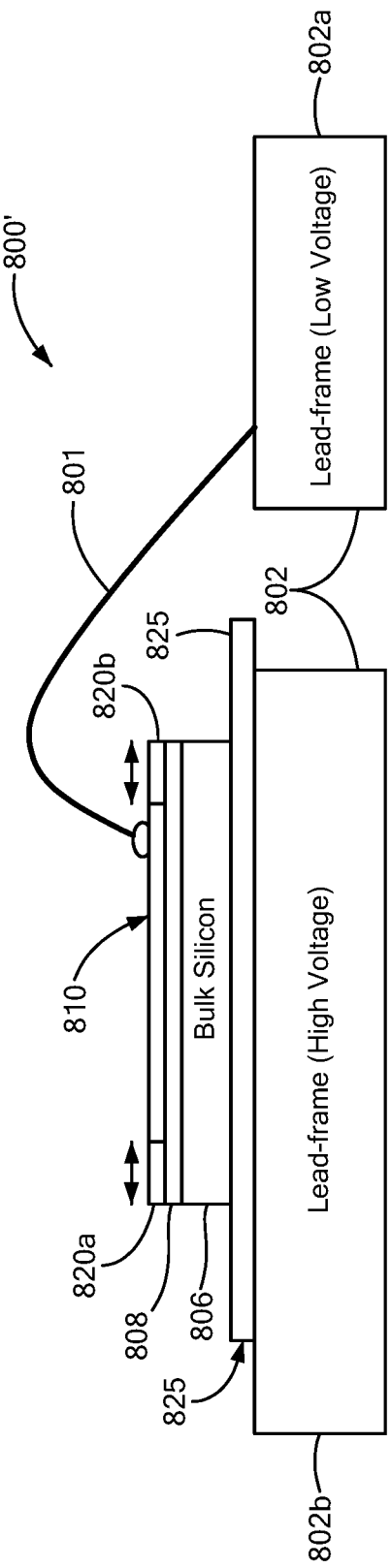
FIG. 8B is a schematic representation of another current sensing having enhanced isolation with a SOI substrate in a die up configuration.

FIG. 8B shows an example current sensor 800' having a die up configuration similar to that shown in FIG. 8A with the addition of a non-conductive layer 825 comprising tape and/or non-conductive die-attach between the die 804 and leadframe 802 to add insulation. In embodiments, the non-conductive layer 825 in the form of die-attach material only covers the leadframe 802 in the area in which the die is located. In embodiments, the non-conductive layer 825 in the form of tape is larger than the die 804. If the non-conductive layer 825 is sufficient to achieve isolation greater than a given threshold, such as 5 kV, then one effectively has two layers of isolation and can obtain reinforced isolation as long as the distance through mold compound and/or cemented joints is greater than about 0.4 mm, for example.

It is understood that the current sensors shown in FIGS. 7A to 8B may or may not have an isolation area, such as the isolation areas shown in FIGS. 1 and 4A-6B.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A current sensor comprising:
    a leadframe having a first portion and a second portion, wherein the first portion of the leadframe includes a current conductor, wherein the leadframe comprises a conductive material;
    a magnetic field sensing element positioned in relation to the current conductor for detecting a magnetic field generated by current flow through the current conductor; and
    a die supported by at least a portion of the first and/or second portions of the leadframe, wherein the first portion of the lead frame includes an isolation region aligned with a first edge of the die, wherein a shortest distance from the first edge of the die to a location on the first portion of the leadframe is greater with the isolation region in the first portion of the leadframe than without the isolation region.

2. The current sensor according to claim 1, further including an insulative layer applied to a surface of the die that faces the leadframe.

3. The current sensor according to claim 1, wherein first edge of the die extends into the isolation region.

4. The current sensor according to claim 1, wherein the isolation region is at least partially filled with insulative mold compound.

5. The current sensor according to claim 1, wherein the current conductor has a U-shaped portion aligned with the magnetic field sensing element.

6. The current sensor according to claim 1, wherein a length of the isolation region is greater than a length of the first edge of the die.

7. The current sensor according to claim 1, wherein the die is configured in a flip chip configuration.

8. The current sensor according to claim 1, wherein the die is configured in a die-up configuration.

9. The current sensor according to claim 1, wherein the die is configured in a chip-on-lead configuration.

10. The current sensor according to claim 1, wherein the die comprises a silicon-on-insulator (SOI) configuration.

11. The current sensor according to claim 10, wherein the die comprises a bulk silicon layer, an oxide layer, and an active layer.

12. The current sensor according to claim 11, further including a nonconductive layer abutting the active layer.

13. The current sensor according to claim 12, further including a trench formed in the active layer and at an edge of the die, wherein the trench is filled with an insulative material.

14. The current sensor according to claim 13, wherein the second leadframe portion is configured for a higher voltage than the first leadframe portion and the trench is located above the second portion of the leadframe.

15. The current sensor according to claim 12, wherein the active layer is divided into first and second portions and electrically isolated from each other by an isolation island, wherein the first portion of the active layer is electrically connected to the first leadframe portion and the second portion of the active layer is electrically connected to the second leadframe portion, wherein the second leadframe portion is configured for a higher voltage than the first leadframe portion, and wherein the sensor has a flip chip configuration.

16. The current sensor according to claim 1, wherein the die comprises a bulk silicon layer, an oxide layer, and an active layer, wherein the bulk silicon layer is disposed on the second portion of the leadframe in a die up configuration.

17. The sensor according to claim 16, wherein the second leadframe portion is configured for a higher voltage than the first leadframe portion, and wherein the sensor has a flip chip configuration, and the active layer is wirebonded to the first leadframe portion.

18. The current sensor according to claim 17, wherein the active layer is surrounded by a trench filled with insulative material.

19. The current sensor according to claim 18, further including a layer of non- conductive material between the bulk silicon layer and the second leadframe portion.

20. A current sensor comprising:
    a conductive leadframe having a first portion and a second portion, wherein the first portion of the leadframe includes a current conductor, and wherein the first and second portions of the leadframe are separate from each other;
    a magnetic field sensing element positioned in relation to the current conductor for detecting a magnetic field generated by current flow through the current conductor; and
    a silicon-on-insulator (SOI) die supported by at least a portion of the first and/or second portions of the leadframe, wherein the die comprises a silicon layer, an oxide layer, and an active layer,
    wherein the die further includes an insulative adhesive layer on the active layer, and
    wherein the die is supported by the first and second portions of the leadframe, wherein the active layer is separated into separate first and second portions by an oxide island, wherein the first portion of the active layer is connected to the first portion of the leadframe and the second portion of the active layer is connected to the second portion of the active layer.

21. The current sensor according to claim 20, wherein the active layer includes an oxide portion located at an edge of the active layer.

22. The current sensor according to claim 21, wherein the second portion of the leadframe is configured for a lower voltage than the first portion of the leadframe, wherein the active layer is coupled to the second portion of the leadframe.

23. The current sensor according to claim 22, wherein oxide portion located at an edge of the active layer is aligned over the first portion of the leadframe.

24. The current sensor according to claim 20, wherein the adhesive layer comprises BCB or polyimide.

25. The current sensor according to claim 20, wherein the first portion of the active layer is connected to the first portion of the leadframe by a first via and a first solder bump and the second portion of the active layer is connected to the second portion of the active layer by a second via and a second solder bump.

26. The current sensor according to claim 20, wherein the current sensor has a die up configuration, wherein the silicon layer of the die rests on the first portion of the leadframe, and wherein the active layer of the die is connected to the second portion of the leadframe by a wirebond.

27. The current sensor according to claim 20, wherein the active layer includes first and second oxide portions at edges of the die.

28. The current sensor according to claim 20, further including a non-conductive layer between the silicon layer and the first portion of the leadframe.

29. The current sensor according to claim 28, wherein the non-conductive layer comprises tape having a larger area than an area of a leadframe-side of the die.

30. The current sensor according to claim 28, wherein the non-conductive layer comprises a die attach material.

31. The current sensor according to claim 20, wherein the first portion of the lead frame includes an isolation region aligned with a first edge of the die.

32. The current sensor according to claim 31, further including an insulative layer applied to a surface of the die that faces the leadframe.

33. The current sensor according to claim 31, wherein the first edge of the die extends into the isolation region.

34. The current sensor according to claim 33, wherein the isolation region is at least partially filled with insulative mold compound.

35. The current sensor according to claim 33, wherein a shortest distance from the die edges to a location on the first portion of the leadframe is greater with the isolation region than without the isolation region.

* * * * *